(12) United States Patent
Inuzuka

(10) Patent No.: US 12,279,439 B2
(45) Date of Patent: Apr. 15, 2025

(54) SEMICONDUCTOR STORAGE DEVICE

(71) Applicant: Kioxia Corporation, Tokyo (JP)

(72) Inventor: Yuki Inuzuka, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 845 days.

(21) Appl. No.: 17/468,229

(22) Filed: Sep. 7, 2021

(65) Prior Publication Data

US 2022/0302214 A1    Sep. 22, 2022

(30) Foreign Application Priority Data

Mar. 18, 2021  (JP) .................................. 2021-045100

(51) Int. Cl.
*H10B 63/00*   (2023.01)
*H10N 70/20*   (2023.01)

(52) U.S. Cl.
CPC ............ *H10B 63/30* (2023.02); *H10B 63/20* (2023.02); *H10B 63/84* (2023.02); *H10N 70/231* (2023.02)

(58) Field of Classification Search
CPC ..................................................... H10B 63/30
See application file for complete search history.

(56) References Cited

U.S. PATENT DOCUMENTS

| | | | |
|---|---|---|---|
| 11,682,455 B2 * | 6/2023 | Miyazaki | G11C 13/0026 365/148 |
| 2016/0268343 A1 | 9/2016 | Sugimae | |
| 2020/0321046 A1 * | 10/2020 | Cho | G11C 13/0026 |

FOREIGN PATENT DOCUMENTS

| JP | 5180913 B2 | 4/2013 |
|---|---|---|
| JP | 2013-200930 A | 10/2013 |

* cited by examiner

*Primary Examiner* — Mounir S Amer
(74) *Attorney, Agent, or Firm* — Foley & Lardner LLP

(57) ABSTRACT

A memory includes first and second wires. First and second transistors are connected to the first wires and transfer a first and second voltage. Third and fourth transistors are connected to the second wires and transfer the first and second voltages to the second wires. A first memory cell includes a first diode and a first memory element connected in series. The first diode is connected so that a forward bias direction thereof is from the one first wire to the first signal line. A second memory cell includes a second diode and a second memory element connected in series. The second diode is connected so that a forward bias direction thereof is from the second signal line to the one first wire.

11 Claims, 8 Drawing Sheets

SEMICONDUCTOR STORAGE DEVICE

CROSS REFERENCE TO RELATED APPLICATIONS

This application is based upon and claims the benefit of priority from the prior Japanese Patent Application No. 2021-045100, filed on Mar. 18, 2021, the entire contents of which are incorporated herein by reference.

FIELD

The embodiments of the present invention relate to a semiconductor storage device.

BACKGROUND

Variable resistance elements that can store therein data by using two resistance values, for example, a high resistance state and a low resistance state are used as memory cells of a semiconductor storage device in some cases. In order to detect the data of such memory cells, hookup transistors (hereinafter, also HU transistors) each applying a high voltage or a low voltage are provided for word lines and bit lines. In a case where the HU transistors are provided as a CMOS (Complementary Metal Oxide Semiconductor) circuit that control a memory cell array, it is desired to reduce the number of the HU transistors in order to reduce the circuit scale of the CMOS circuit.

DETAILED DESCRIPTION

Figure 1:
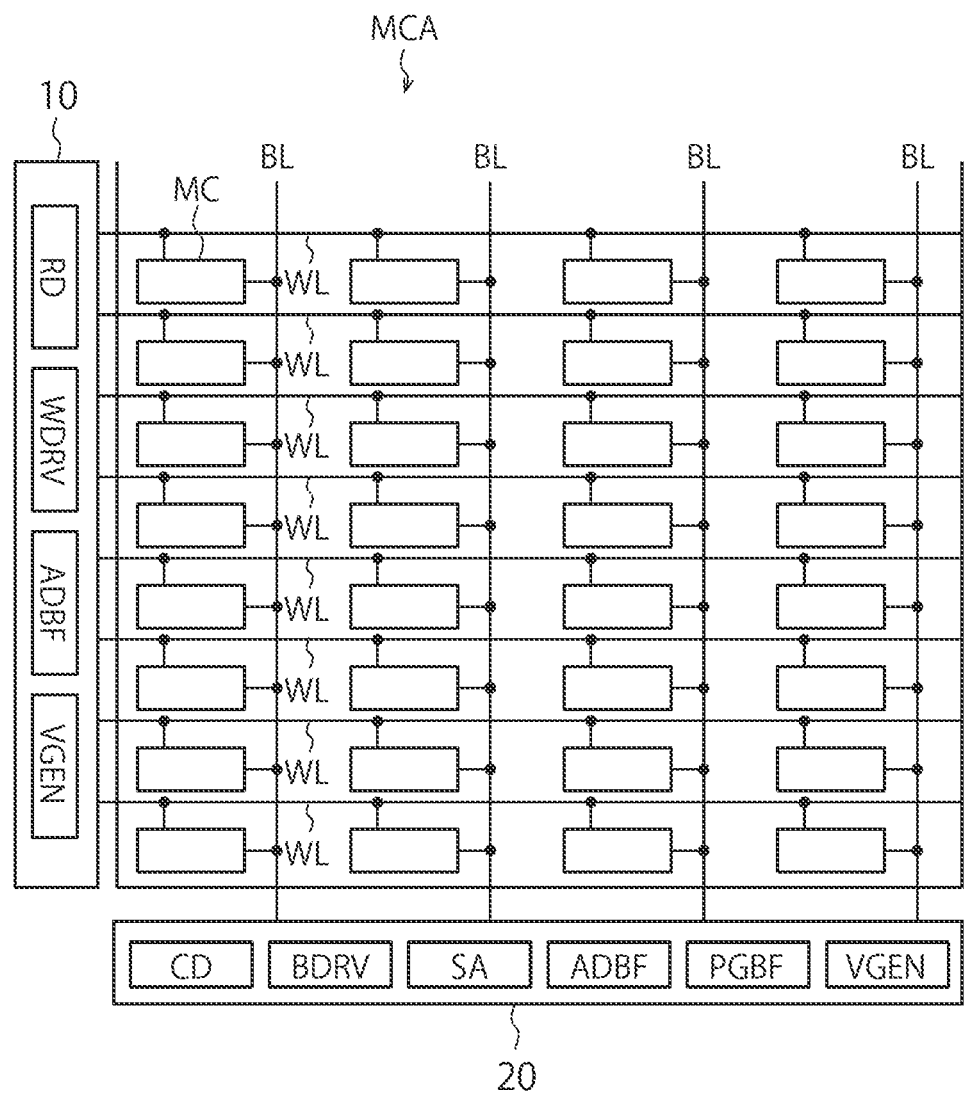
FIG. 1 is a diagram illustrating a configuration example of a nonvolatile semiconductor storage device according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A semiconductor storage device according to the present embodiments includes a plurality of first wires and a plurality of second wires. First and second transistors are connected to one or ones of the first wires and are configured to respectively transfer a first voltage and a second voltage lower than the first voltage to the connected first wire or wires. Third and fourth transistors are connected to the second wires and are configured to respectively transfer the first and second voltages to the second wires. A first memory cell includes a first diode and a first memory element connected in series, and is connected between a first signal line of the second wires and one of the first wires in such a manner that a forward bias direction of the first diode is from the one first wire to the first signal line. A second memory cell includes a second diode and a second memory element connected in series, and is connected between a second signal line of the second wires and the one of the first wires in such a manner that a forward bias direction of the second diode is from the second signal line to the one first wire.

First Embodiment

FIG. 1 is a diagram illustrating a configuration example of a nonvolatile semiconductor storage device according to a first embodiment. A nonvolatile semiconductor storage device 100 (hereinafter, simply "storage device 100") can be applied to a unipolar memory, for example, a phase-change random access memory (PRAM (Phase-Change RAM) or PCM (Phase-Change Memory)) or an interfacial phase-change random access memory (iPCM (interfacial PCM)). The unipolar memory is a memory to which data can be written by voltage application from one direction. The storage device 100 includes a memory cell array MCA and control circuits 10 and 20 as peripheral circuits.

The memory cell array MCA includes a plurality of memory cells MC storing data therein, which are arranged two-dimensionally or three-dimensionally. The memory cell array MCA includes a plurality of word lines WL and a plurality of bit lines BL. The word lines WL and the bit lines BL intersect with each other, for example, substantially at right angles in a planar layout. Each memory cell MC is provided to correspond to an intersection of the bit line BL and the word line WL and is connected between them. Therefore, the memory cell array MCA is a so-called "cross-point memory cell array". The number of the word lines WL, the number of the bit lines BL, and the number of the memory cells MC are not specifically limited.

The memory cells MC each include a selector, a diode, and a PCM element. The configurations of the memory cell array MCA and the memory cells MC will be described later.

The control circuits 10 and 20 control the memory cell array MCA. The control circuit 10 includes a row decoder RD, a word line driver WDRV, an address buffer ADBF, and a voltage generation circuit VGEN, for example. The control circuit 20 includes a column decoder CD, a bit line driver BDRV, a sense amplifier SA, an address buffer ADBF, a page buffer PGBF, and a voltage generation circuit VGEN, for example.

When data is read/written/erased, the address buffer ADBF receives from outside an address signal of the word line WL or the bit line BL that is to be selected, and temporarily retains the address signal. The address buffer ADBF supplies the address signal to the row decoder RD or the column decoder CD.

The row decoder RD decodes the address signal, and selects one of the word lines WL in accordance with the address signal. The word line driver WDRV applies a predetermined voltage to the selected word line WL via the row decoder RD to enable a read/write/erase operation to be performed.

The column decoder CD decodes the address signal, and selects one of the bit lines BL in accordance with the address signal. The bit line driver BDRV applies a predetermined voltage to the selected bit line BL to enable a read/write/erase operation to be performed. The sense amplifier SA detects data read out from the selected bit line BL and transfers the data to the page buffer PGBF. The page buffer PGBF temporarily retains (latches) data to be written to the selected bit line BL or the data read out from the selected bit line BL.

Each of the voltage generation circuits VGEN of the control circuits 10 and 20 is a booster circuit or a step-down circuit that generates various voltages to be applied to the selected word line WL or the selected bit line BL from an external power source.

With this configuration, the control circuits 10 and 20 can select any word line WL and any bit line BL and apply various voltages thereto, respectively. As a result, it is possible to perform a read/write/erase operation for the memory cell MC connected between the selected word line WL and the selected bit line BL (a selected cell).

Figure 2A:
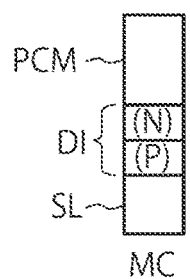
FIG. 2A is a schematic cross-sectional view illustrating a configuration of a memory cell.
Figure 2B:
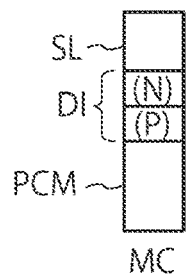
FIG. 2B is a schematic cross-sectional view illustrating a configuration of the memory cell.

FIGS. 2A and 2B are schematic cross-sectional views illustrating a configuration of the memory cell MC. The memory cell MC includes a PCM element, a diode DI, and a selector SL. The PCM element, the diode DI, and the selector SL are connected in series between a corresponding bit line BL and a corresponding word line WL.

In the memory cell MC illustrated in FIG. 2A, the PCM element is connected to the cathode side of the diode DI, and the selector SL is connected to the anode side. In the memory cell MC illustrated in FIG. 2B, the PCM element is connected to the anode side of the diode DI, and the selector SL is connected to the cathode side of the diode DI. That is, with respect to the diode DI, the positions of the PCM element and the selector SL may be exchanged. Further, the position of the diode DI may not be between the PCM element and the selector SL, but be at one end of the arrangement of the PCM element and the selector SL, although not illustrated. Either of the memory cells MC illustrated in FIGS. 2A and 2B may be used in the present embodiment. A MOSFET (Metal Oxide Semiconductor Field Effect Transistor) is used for the selector SL, for example.

Figure 3A:
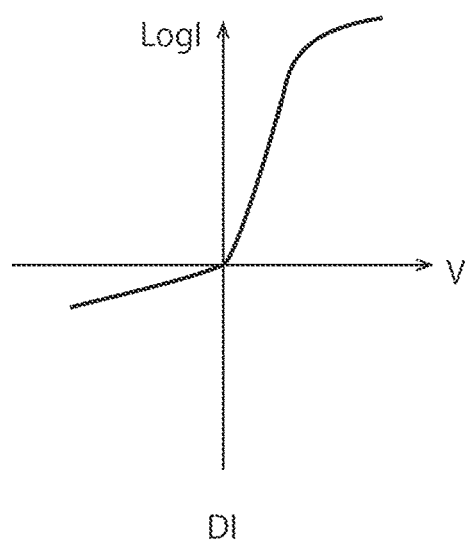
FIG. 3A is a graph illustrating the I-V characteristics of a diode.
Figure 3B:
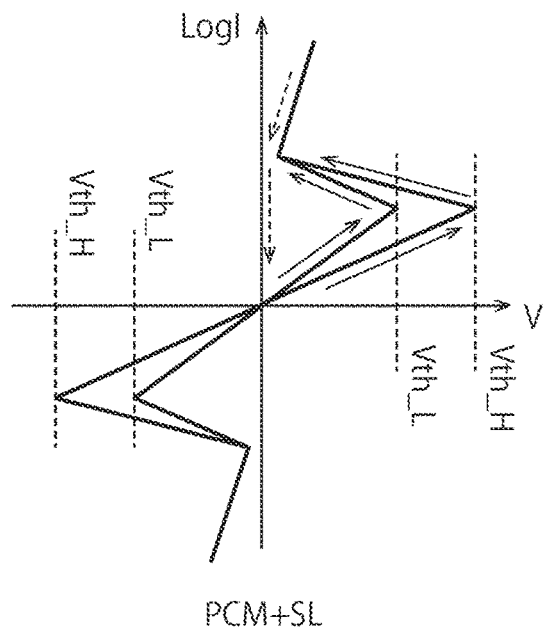
FIG. 3B is a graph illustrating the I-V characteristics of a PCM element and a selector.
Figure 3C:
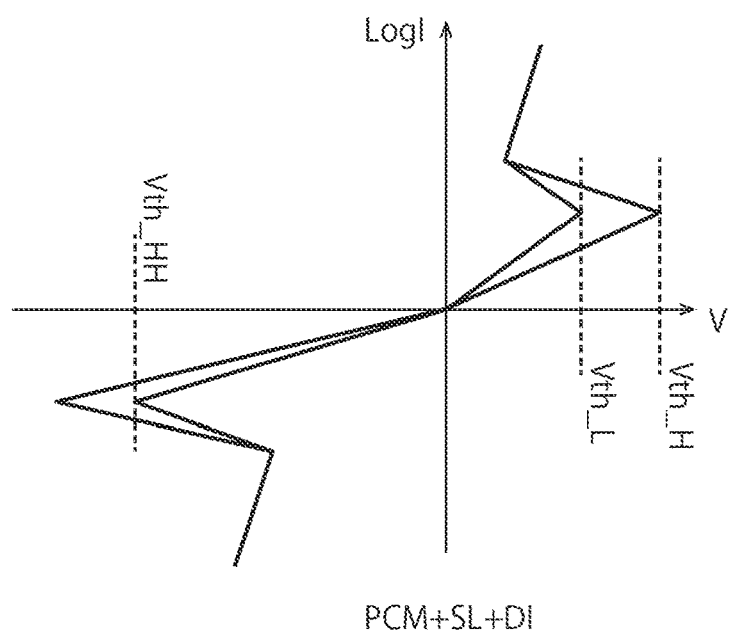
FIG. 3C is a graph illustrating the I-V characteristics of a memory cell including the PCM element, the diode, and the selector.

FIG. 3A is a graph illustrating the I-V characteristics of the diode DI. FIG. 3B is a graph illustrating the I-V characteristics of a PCM element and the selector SL. FIG. 3C is a graph illustrating the I-V characteristics of the memory cell MC including the PCM element, the diode DI, and the selector SL. The horizontal axis represents a voltage applied across both ends of the memory cell MC. The vertical axis represents a current flowing through the memory cell MC in logarithm.

As illustrated in FIG. 3A, in the diode DI, a large current flows when a voltage is applied in a direction of forward bias (+V direction), and almost no current flows when a voltage is applied in a direction of reverse bias (−V direction). Therefore, the diode DI has a rectification function and has the polarity-dependent I-V characteristics.

As illustrated in FIG. 3B, the PCM element has a plurality of resistance states. When a voltage applied to the PCM element is raised, a current flows as illustrated with solid arrows. That is, the current flowing through the PCM element increases with the voltage to a threshold voltage $Vth\_L$ at which the PCM element is in a low resistance state or a threshold voltage $Vth\_H$ at which the PCM element is in a high resistance state. When the applied voltage exceeds the threshold voltage $Vth\_L$ or $Vth\_H$, the current flowing through the PCM element increases even if the voltage is reduced to some extent. As described above, the PCM element has such characteristics that, after the applied voltage exceeds the threshold voltage $Vth\_L$ or $Vth\_H$, the current flowing therethrough is increased even if the applied voltage is reduced. Further, by reducing the applied voltage to a predetermined voltage and then raising it again, the PCM element increases the current. In a case where the applied voltage does not exceed the threshold voltage $Vth\_L$ or $Vth\_H$, the current flowing through the PCM element follows the solid arrows in the opposite direction and decreases.

Meanwhile, in a case where the applied voltage is reduced from a state where the PCM element allows the current to flow therethrough, the current is reduced to zero when the applied voltage falls below the predetermined voltage, as illustrated with broken arrows.

In this manner, the low resistance state (the threshold voltage $Vth\_L$) and the high resistance state (the threshold voltage $Vth\_H$) of the PCM element correspond to a first logic (for example, "0") and a second logic (for example, "1"), respectively. Accordingly, by setting a read voltage applied to the PCM element to a voltage between the threshold voltages $Vth\_L$ and $Vth\_H$, it is possible to detect a logic of data stored in the PCM element based on a value of the current flowing through the PCM element.

Also in a case where a negative voltage in a reverse direction is applied, the PCM element operates in an identical manner except that the polarity of the current is changed. Therefore, the PCM element has the I-V characteristics in which there is almost no bias due to the polarity and there is no polarity dependence, as illustrated in FIG. 3B.

As illustrated in FIG. 3C, when the diode DI is combined with the PCM element, it is possible to provide polarity dependence of the diode DI in FIG. 3A to the characteristics of the PCM element illustrated in FIG. 3B. Assuming that the positive voltage (+V) is a voltage in a forward bias direction of the diode DI, an operation in a positive voltage direction is substantially the same as that in FIG. 3B. However, in a negative voltage direction, since the diode DI allows almost no current to flow therethrough, a threshold voltage $|Vth\_HH|$ is larger than a threshold voltage $|Vth\_H|$. Therefore, even when the applied voltage exceeds the threshold voltage $|Vth\_L|$ or $|Vth\_H|$, the memory cell MC allows almost no current to flow therethrough. When the diode DI is broken down, a current flows and the characteristics of the PCM element appear. As described above, it is possible to provide polarity dependence to the I-V characteristics of the PCM element by combining the PCM element and the diode DI with each other. For example, a memory cell MC1 and a memory cell MC2 are memory cells having dependence on reverse polarities to each other. That is, the memory cell MC according to the present embodiment is a unipolar memory cell to which the first logic and the second logic that is inverse to the first logic can be written by voltage application from one direction.

Figure 4:
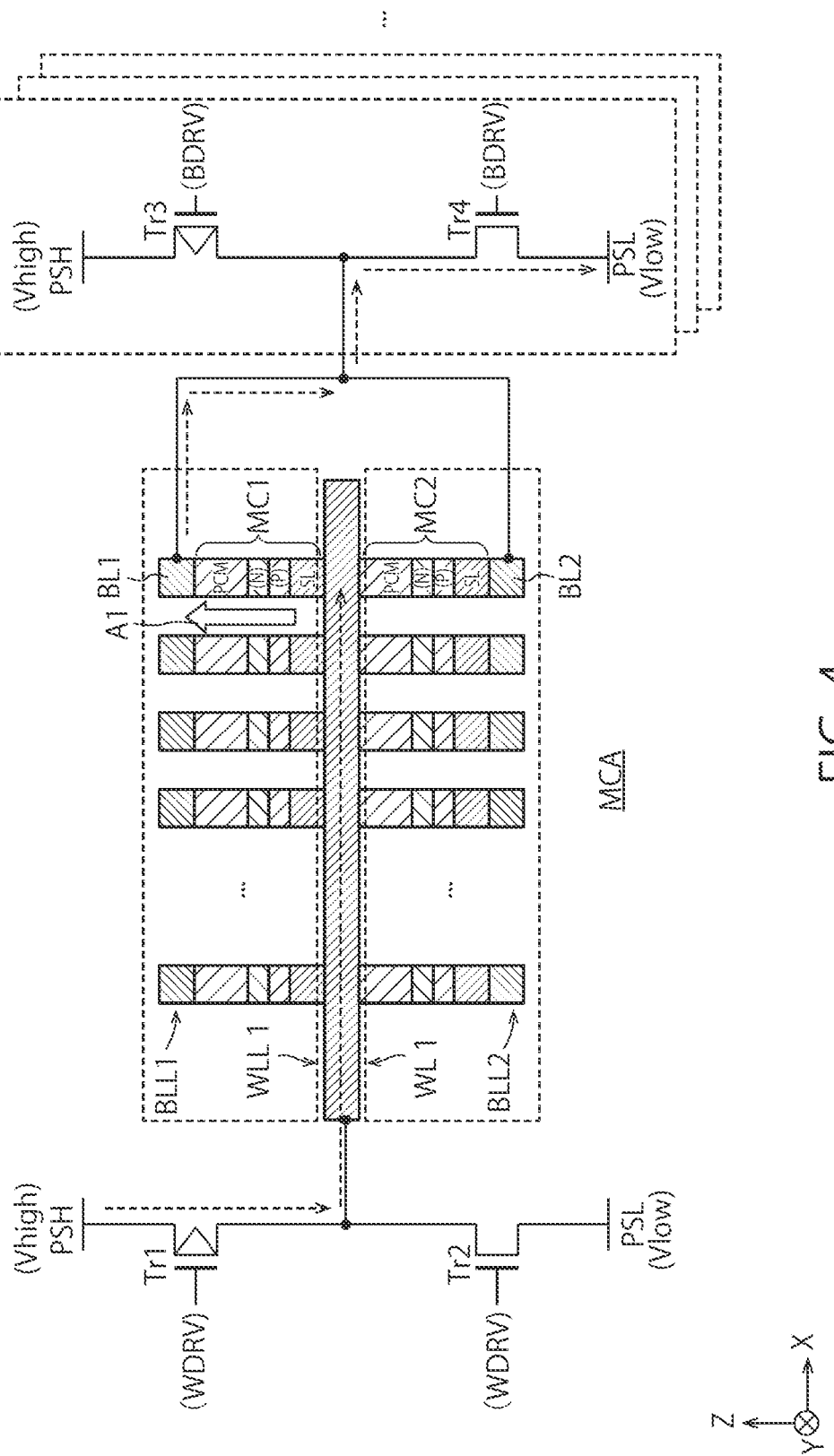
FIG. 4 is a schematic diagram illustrating an example of the storage device according to the first embodiment.

FIG. 4 is a schematic diagram illustrating an example of the storage device 100 according to the first embodiment. The storage device 100 includes the plural word lines WL, a plurality of bit lines BL1 and BL2, the plural memory cells MC1 and MC2, and transistors Tr1 to Tr4.

The word lines WL as first wires extend in the X direction. The word lines WL are arranged in the Y direction. The bit lines BL1 and BL2 as second wires extend in the Y direction. The bit lines BL1 are arranged in the X direction and the bit lines BL2 are also arranged in the X direction.

A wiring layer BLL1 of the bit lines BL1 and a wiring layer BLL2 of the bit lines BL2 are provided to correspond to a wiring layer of the word lines WL1 on both sides of the wiring layer of the word lines WL1 in the Z direction. That is, the wiring layer (first wiring layer) WLL1 of the word lines WL and the wiring layer (second wiring layer) BLL1 or BLL2 of the bit lines BL are alternately stacked.

The memory cells MC1 are provided between the wiring layer WLL1 and the wiring layer BLL1. The memory cells MC1 as first memory cells each include a PCM element, the diode DI, and the selector SL connected in series, as described above. The diode DI of the memory cell MC1 is connected between the word line WL1 and the bit line BL1 (first signal line) in such a manner that its forward bias direction is from the word line WL1 to the bit line BL1.

The memory cells MC2 are provided between the wiring layer WLL1 and the wiring layer BLL2. The diode DI of the memory cell MC2 as a second memory cell is connected between the word line WL1 and the bit line BL2 (second signal line) in such a manner that its forward bias direction is from the bit line BL2 to the word line WL1. Each of the memory cells MC1 and MC2 may be the memory cells MC illustrated in either FIG. 2A or 2B.

The word line WL1 is connected to the p-type transistor Tr1 as a first transistor and an n-type transistor Tr2 as a second transistor. The source of the transistor Tr1 is connected to a high voltage source PSH as a first voltage source, and its drain is connected to the word line WL1. The gate of the transistor Tr1 is connected to the word line driver WDRV and receives a control signal from the word line driver WDRV. Accordingly, the transistor Tr1 is controlled to be turned on/off, thereby being able to transfer a high voltage Vhigh of the high voltage source PSH to the word line WL1. Meanwhile, the source of the transistor Tr2 is connected to a voltage Vlow of a low voltage source PSL as a second voltage source, which is lower than the high voltage Vhigh, and its drain is connected to the word line WL1. The gate of the transistor Tr2 is connected to the word line driver WDRV and receives a control signal from the word line driver WDRV. Accordingly, the transistor Tr2 is controlled to be turned on/off, thereby being able to transfer the low voltage Vlow of the low voltage source to the word line WL1.

The bit lines BL1 and BL2 are connected to the p-type transistor Tr3 as a third transistor and an n-type transistor Tr4 as a fourth transistor. The source of the transistor Tr3 is connected to the high voltage source PSH, and its drain is connected to the bit lines BL1 and BL2 in common. The gate of the transistor Tr3 is connected to the bit line driver BDRV and receives a control signal from the bit line driver BDRV. Accordingly, the transistor Tr3 is controlled to be turned on/off, thereby being able to transfer the high voltage Vhigh to the bit lines BL1 and BL2. Meanwhile, the source of the transistor Tr4 is connected to the low voltage source PSL, and its drain is connected to the bit lines BL1 and BL2 in common. The gate of the transistor Tr4 is connected to the bit line driver BDRV and receives a control signal from the bit line driver BDRV. Accordingly, the transistor Tr4 is controlled to be turned on/off, thereby being able to transfer the low voltage Vlow to the bit lines BL1 and BL2.

The transistors Tr1 and Tr2 are connected in series between the high voltage source PSH and the low voltage source PSL, and a node between them is connected to the word line WL1. In a case where the wiring layer WLL1 includes the plural word lines WL1, a pair of the transistors Tr1 and Tr2 is provided to correspond to each of the word lines WL1, the number of the pairs being the same as the number of the word lines WL1.

The transistors Tr3 and Tr4 are connected in series between the high voltage source PSH and the low voltage source PSL, and a node between them is connected to the bit lines BL1 and BL2 in common. A pair of the transistors Tr3 and Tr4 is provided to correspond to a pair of the bit lines BL1 and BL2. In a case where the wiring layers BLL1 and BLL2 include a plurality of pairs of the bit lines BL1 and BL2, a pair of the transistors Tr3 and Tr4 is provided for each pair of the bit lines BL1 and BL2.

The storage device 100 having the above-described configuration performs a read operation or a write operation in the following manner.

For example, the word line driver WDRV places the transistor Tr1 in an on state (conducting state), and the bit line driver BDRV places the transistor Tr4 in an on state. The transistors Tr2 and Tr3 are in an off state (non-conducting state) at this time. Accordingly, the high voltage Vhigh is applied to the word line WL1, and the low voltage Vlow is applied to both the bit lines BL1 and BL2. The diode of the memory cell MC1 is connected in a forward direction from the word line WL1 to the bit line BL1. That is, a forward bias is applied to the diode of the memory cell MC1 in this case. Meanwhile, the diode of the memory cell MC2 is connected in a reverse direction from the word line WL1 to the bit line BL2. That is, a reverse bias is applied to the diode of the memory cell MC2 in this case. Therefore, a current flows through the memory cell MC1 and almost no current flows through the memory cell MC2. Accordingly, it is possible to write data to the memory cell MC1 or read data from the memory cell MC1.

For example, the word line driver WDRV places the transistor Tr2 in an on state, and the bit line driver BDRV places the transistor Tr3 in an on state. The transistors Tr1 and Tr4 are in an off state at this time. Accordingly, the low voltage Vlow is applied to the word line WL1, and the high voltage Vhigh is applied to both the bit lines BL1 and BL2. In this case, a reverse bias is applied to the diode of the memory cell MC1. Meanwhile, a forward bias is applied to the diode of the memory cell MC2. Therefore, a current flows through the memory cell MC2 and almost no current flows through the memory cell MC1.

As described above, according to the present embodiment, the memory cell MC is a unipolar memory cell. The memory cell MC has polarity dependence because the diode DI is combined with a PCM element. By providing polarity dependence to the unipolar memory cell MC, it is possible to cause a current to selectively flow through only one in a pair of the memory cells MC1 and MC2. Accordingly, the transistors Tr3 and Tr4 can be shared by a pair of the bit lines BL1 and BL2.

If the memory cell MC is a bipolar memory cell and does not have polarity dependence, it is necessary to provide a pair of the transistors Tr3 and Tr4 for each of the bit lines BL1 and BL2 in order to select either the memory cell MC1 or MC2. In this case, the number of transistors is increased, resulting in increase in the circuit scale of a CMOS circuit.

Meanwhile, according to the present embodiment, the transistors Tr3 and Tr4 can be shared by a pair of the bit lines BL1 and BL2. Accordingly, it is possible to reduce the circuit scale of a CMOS circuit.

In a case where a number of pairs of the bit lines BL1 and BL2 are provided in the wiring layers BLL1 and BLL2, it is possible to further reduce the number of transistors in the CMOS circuit by sharing the transistors Tr3 and Tr4 by the bit lines BL1 and BL2 in each pair. This reduction leads to downscaling of the storage device 100.

The configuration of the memory cell array MCA illustrated in FIG. 4 may be stacked in a plurality of layers in the Z direction. In this case, the configuration illustrated in FIG. 5 or 6 is obtained.

Second Embodiment

Figure 5:
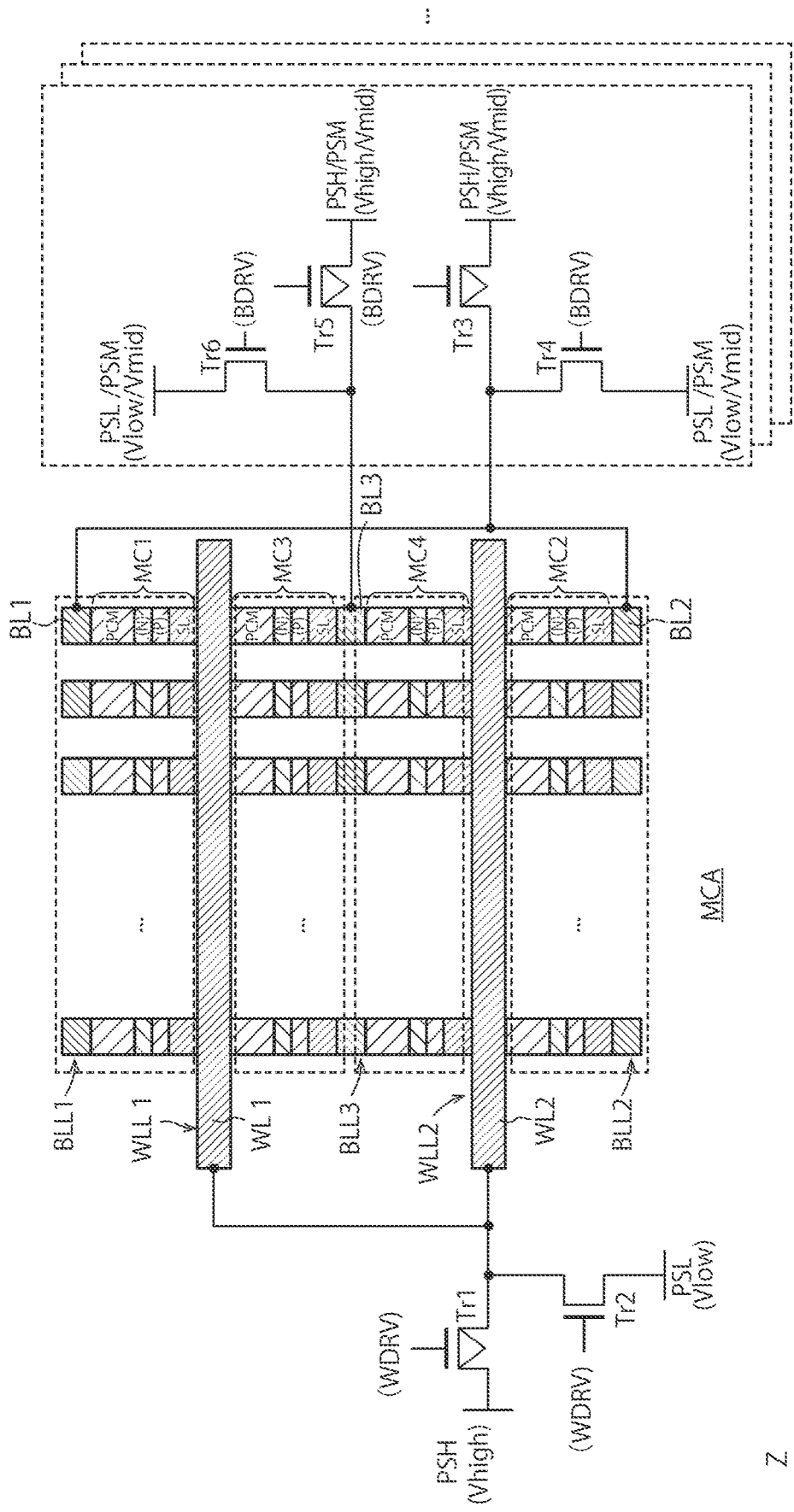
FIG. 5 is a schematic diagram illustrating an example of a storage device according to a second embodiment.
Figure 6:
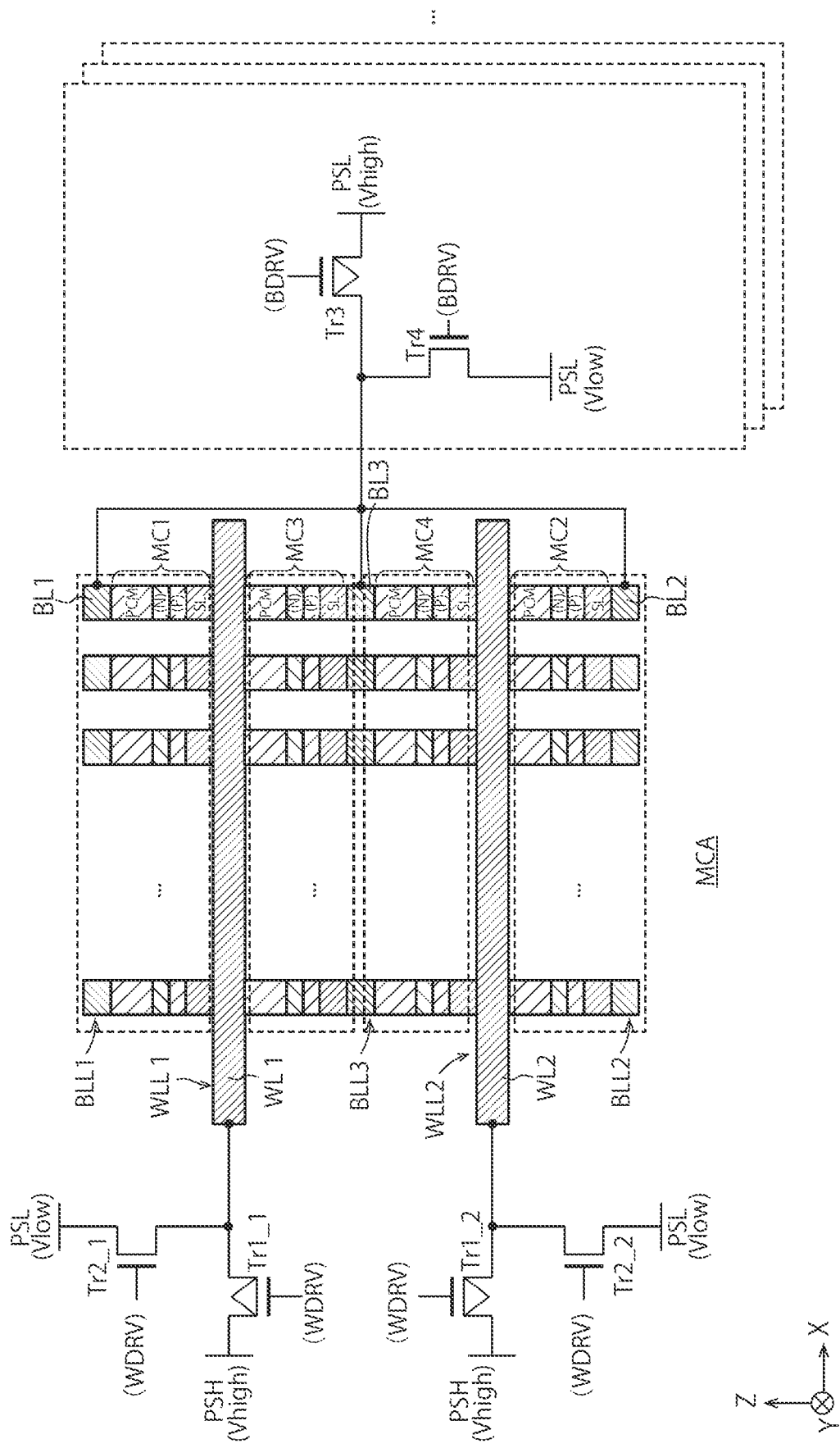
FIG. 6 is a schematic diagram illustrating an example of a storage device according to a third embodiment.

FIG. 5 is a schematic diagram illustrating an example of the storage device 100 according to a second embodiment. In the second embodiment, a wiring layer WLL2 including a plurality of word lines WL2 is provided in addition to the wiring layer WLL1. Further, a wiring layer BLL3 including a plurality of bit lines BL3 is provided in addition to the wiring layers BLL1 and BLL2. The wiring layer BLL3 is provided between the wiring layers WLL1 and BLL2. That is, the wiring layers WLL1 and WLL2 of word lines and the wiring layers BLL1 to BLL3 of bit lines are alternately stacked. Further, memory cells MC1 to MC4 are respectively provided between the word line WL1 and the bit line BL1, between the word line WL2 and the bit line BL2, between the word line WL1 and the bit line BL3, and between the word line WL2 and the bit line BL3. That is, in the second embodiment, the memory cells MC1 to MC4 in four layers are stacked between the word lines WL1 and WL2 and the bit lines BL1 to BL3.

The bit lines BL3 are provided to correspond to respective pairs of the bit lines BL1 and BL2, the number of which is the same as the number of the pairs of the bit lines BL1 and BL2. The bit lines BL3 form the wiring layer BLL3.

The transistors Tr1 and Tr2 are connected to the word lines WL1 and WL2 in common. The transistors Tr3 and Tr4 are connected to the bit lines BL1 and BL2 in common. Further, transistors Tr5 and Tr6 are connected to the bit line BL3.

The transistors Tr5 and Tr6 are connected in series between the high voltage source PSH and the low voltage source PSL. A node between the transistors Tr5 and Tr6 is connected to the bit line BL3. Accordingly, the high voltage Vhigh or the low voltage Vlow can be applied to the bit line BL3. Further, the transistors Tr5 and Tr6 can be connected also to a middle voltage source PSM, thereby being able to apply a middle voltage Vmid to the bit line BL3. The middle voltage source PSM is a source of the middle voltage Vmid between the high voltage Vhigh and the low voltage Vlow.

A p-MOSFET is used as the transistor Tr5, for example, and an n-MOSFET is used as the transistor Tr6, for example. Pairs of the transistors Tr5 and Tr6 are provided to correspond to the respective bit lines BL3, the number of which is the same as the number of the bit lines BL3. In a case where the wiring layer BLL3 includes the plural bit lines BL3, the pair of the transistors Tr5 and Tr6 is provided for each bit line BL3.

The transistors Tr5 and Tr6 apply the middle voltage Vmid to the bit line BL3 when either transistor Tr3 or Tr4 transfers the high voltage Vhigh or the low voltage Vlow. Meanwhile, each of the transistors Tr3 and Tr4 can also apply the middle voltage Vmid in addition to the high voltage Vhigh or the low voltage Vlow. The transistors Tr3 and Tr4 apply the middle voltage Vmid to the bit lines BL1 and BL2 when either transistor Tr5 or Tr6 transfers the high voltage Vhigh or the low voltage Vlow.

The memory cell MC3 has a configuration that is basically the same as that of the memory cells MC1 and MC2. The memory cell MC3 is connected between the word line WL1 and the bit line BL3 in such a manner that the forward bias direction of its diode DI is from the bit line BL3 to the word line WL1.

The memory cell MC4 has a configuration that is basically the same as that of the memory cells MC1 and MC2. The memory cell MC4 is connected between the word line WL2 and the bit line BL3 in such a manner that the forward bias direction of its diode DI is from the word line WL2 to the bit line BL3. Each of the memory cells MC1 to MC4 may be the memory cell MC illustrated in either FIG. 2A or 2B.

The storage device 100 according to the second embodiment performs a read operation or a write operation in the following manner.

In a case of selecting the memory cell MC1, the word line driver WDRV places the transistor Tr1 in an on state to apply the high voltage Vhigh to the word lines WL1 and WL2. In addition, the bit line driver BDRV places the transistor Tr4 in an on state to apply the low voltage Vlow to the bit lines BL1 and BL2. The bit line driver BDRV places either the transistor Tr5 or Tr6 in an on state to apply the middle voltage Vmid to the bit line BL3. Accordingly, a forward bias is applied to the memory cell MC1, so that a current flows from the word line WL1 to the bit line BL1. As a result, it is possible to write data to the memory cell MC1 or read data from the memory cell MC1.

Since a reverse bias is applied to the memory cell MC2 at this time, almost no current flows through the memory cell MC2. In addition, the bit line BL3 has the middle voltage Vmid and thus a sufficient voltage is not applied to the memory cells MC3 and MC4. Therefore, data is not written to the memory cells MC3 and MC4, or data is not read from the memory cells MC3 and MC4.

In a case of selecting the memory cell MC2, the word line driver WDRV places the transistor Tr2 in an on state to apply the low voltage Vlow to the word lines WL1 and WL2. In addition, the bit line driver BDRV places the transistor Tr3 in an on state to apply the high voltage Vhigh to the bit lines BL1 and BL2. The bit line driver BDRV places either the transistor Tr5 or Tr6 in an on state to apply the middle voltage Vmid to the bit line BL3. Accordingly, a forward bias is applied to the memory cell MC2, so that a current flows from the bit line BL2 to the word line WL2. As a result, it is possible to write data to the memory cell MC2 or read data from the memory cell MC2.

Since a reverse bias is applied to the memory cell MC1 at this time, almost no current flows through the memory cell MC1. In addition, the bit line BL3 has the middle voltage Vmid and thus a sufficient voltage is not applied to the memory cells MC3 and MC4. Therefore, data is not written to the memory cells MC3 and MC4, or data is not read from the memory cells MC3 and MC4.

In a case of selecting the memory cell MC3, the word line driver WDRV places the transistor Tr2 in an on state to apply the low voltage Vlow to the word lines WL1 and WL2. In addition, the bit line driver BDRV places the transistor Tr5 in an on state to apply the high voltage Vhigh to the bit line BL3. The bit line driver BDRV places either the transistor Tr3 or Tr4 in an on state to apply the middle voltage Vmid to the bit lines BL1 and BL2. Accordingly, a forward bias is applied to the memory cell MC3, so that a current flows from the bit line BL3 to the word line WL1. As a result, it is possible to write data to the memory cell MC3 or read data from the memory cell MC3.

In a case of selecting the memory cell MC1 or MC2, it suffices that the bit line driver BDRV connects the middle voltage source PSM to the transistor Tr5 or Tr6. In a case of selecting the memory cell MC3 or MC4, it suffices that the bit line driver BDRV connects the middle voltage source PSM to the transistor Tr3 or Tr4.

Since a reverse bias is applied to the memory cell MC4 at this time, almost no current flows through the memory cell MC4. In addition, the bit lines BL1 and BL2 have the middle voltage Vmid and thus a sufficient voltage is not applied to the memory cells MC1 and MC2. Therefore, data is not written to the memory cells MC1 and MC2, or data is not read from the memory cells MC1 and MC2.

In a case of selecting the memory cell MC4, the word line driver WDRV places the transistor Tr1 in an on state to apply the high voltage Vhigh to the word lines WL1 and WL2. In addition, the bit line driver BDRV places the transistor Tr6 in an on state to apply the low voltage Vlow to the bit line BL3. The bit line driver BDRV places either the transistor Tr3 or Tr4 in an on state to apply the middle voltage Vmid to the bit lines BL1 and BL2. Accordingly, a forward bias is applied to the memory cell MC4, so that a current flows from the word line WL2 to the bit line BL3. As a result, it is possible to write data to the memory cell MC4 or read data from the memory cell MC4.

Since a reverse bias is applied to the memory cell MC3 at this time, almost no current flows through the memory cell MC3. In addition, the bit lines BL1 and BL2 have the middle voltage Vmid and thus a sufficient voltage is not applied to the memory cells MC1 and MC2. Therefore, data is not written to the memory cells MC1 and MC2, or data is not read from the memory cells MC1 and MC2.

As described above, according to the second embodiment, the word lines WL1 and WL2 and the bit lines BL1 to BL3 are alternately stacked, and the memory cells MC1 to MC4 in four layers are provided between the bit lines BL1 to BL3 and the word lines WL1 and WL2. A pair of the transistors Tr1 and Tr2 is connected to the word lines WL1 and WL2 in common, and the transistors Tr3 and Tr4 are connected to the bit lines BL1 and BL2 in common. However, since the memory cells MC1 to MC4 in four layers each include the diode DI and have polarity dependence, it is possible to select any of the memory cells MC1 to MC4 by driving the transistors Tr1 to Tr6, thereby making a current flow through the selected memory cell.

If the memory cells MC1 to MC4 are bipolar memory cells and do not have polarity dependence, it is necessary to provide a pair of the transistors Tr3 and Tr4 for each of the bit lines BL1 and BL2 in order to select any of the memory cells MC1 to MC4. Alternatively, it is necessary to provide a pair of the transistors Tr1 and Tr2 for each of the word lines WL1 and WL2. In these cases, the number of transistors is increased, resulting in increase in the circuit scale of a CMOS circuit.

Meanwhile, according to the second embodiment, the transistors Tr1 and Tr2 can be shared by a pair of the word lines WL1 and WL2, and the transistors Tr3 and Tr4 can be shared by a pair of the bit lines BL1 and BL2. Accordingly, it is possible to reduce the circuit scale of a CMOS circuit.

In a case where a number of word lines WL1 and WL2 are included in the wiring layers WLL1 and WLL2, a pair of the transistors Tr1 and Tr2 can be shared by a pair of the word lines WL1 and WL2. Further, in a case where a number of sets of the bit lines BL1 to BL3 are included in the wiring layers BLL1 to BLL3, a pair of the transistors Tr3 and Tr4 can be shared by a pair of the bit lines BL1 and BL2. Accordingly, the number of transistors in a CMOS circuit can be further reduced, leading to downscaling of the storage device 100.

A plurality of the configurations of the memory cell array MCA illustrated in FIG. 5 may be stacked in the Z direction. In this case, it suffices that the wiring layer BLL1 is used also as the wiring layer BLL2 of the upper memory cell array MCA. Also, it suffices that the wiring layer BLL2 is used also as the wiring layer BLL1 of the underlying memory cell array MCA. A pair of the transistors Tr1 and Tr2 is provided for each word line WL1 as in FIG. 4, also in the wiring layer WLL1 of another memory cell array MCA. A pair of the transistors Tr3 and Tr4 is provided for each pair of the bit lines BL1 and BL2 as in FIG. 4, also in the wiring layers BLL1 and BLL2 of the other memory cell array MCA. Accordingly, a number of the memory cell arrays MCA can be stacked in the Z direction.

Third Embodiment

FIG. 6 is a schematic diagram illustrating an example of the storage device 100 according to a third embodiment. In the third embodiment, the transistors Tr3 and Tr4 are connected to the bit lines BL1 to BL3 in common. Meanwhile, different pairs of the transistors Tr1 and Tr2 (Tr1_1 and Tr2_1) and (Tr1_2 and Tr2_2) are connected to the word lines WL1 and WL2, respectively. The configurations of the word lines WL1 and WL2, the bit lines BL1 to BL3, and the memory cells MC1 to MC4 may be identical to those in the second embodiment.

The transistors Tr1_1 and Tr2_1 are connected to the word line WL1. The transistors Tr1_2 and Tr2_2 are connected to the word line WL2. Accordingly, it is possible to selectively apply the high voltage Vhigh or the low voltage Vlow to each of the word lines WL1 and WL2. Accordingly, the transistors Tr3 and Tr4 can be connected to the bit lines BL1 to BL3 in common.

The storage device 100 according to the third embodiment performs a read operation or a write operation in the following manner.

In a case of selecting the memory cell MC1, the word line driver WDRV places the transistor Tr1_1 in an on state to apply the high voltage Vhigh to the word line WL1. The word line driver WDRV places the transistor Tr2_2 in an on state to apply the low voltage Vlow to the word line WL2. In addition, the bit line driver BDRV places the transistor Tr4 in an on state to apply the low voltage Vlow to the bit lines BL1 to BL3. Accordingly, a forward bias is applied to the memory cell MC1, so that a current flows from the word line WL1 to the bit line BL1. As a result, it is possible to write data to the memory cell MC1 or read data from the memory cell MC1.

Since a reverse bias is applied to the memory cell MC3 at this time, almost no current flows through the memory cell MC3. In addition, the word line WL2 and the bit lines BL2 and BL3 have the low voltage Vlow and thus almost no voltage is applied to the memory cells MC2 and MC4. Therefore, data is not written to the memory cells MC2 and MC4, or data is not read from the memory cells MC2 and MC4.

In a case of selecting the memory cell MC2, the word line driver WDRV places the transistor Tr2_2 in an on state to apply the low voltage Vlow to the word line WL2. The word line driver WDRV places the transistor Tr1_1 in an on state to apply the high voltage Vhigh to the word line WL1. In addition, the bit line driver BDRV places the transistor Tr3 in an on state to apply the high voltage Vhigh to the bit lines BL1 to BL3. Accordingly, a forward bias is applied to the memory cell MC2, so that a current flows from the bit line BL2 to the word line WL2. As a result, it is possible to write data to the memory cell MC2 or read data from the memory cell MC2.

Since a reverse bias is applied to the memory cell MC4 at this time, almost no current flows through the memory cell MC4. In addition, the word line WL1 and the bit lines BL1 and BL3 have the high voltage Vhigh and thus almost no voltage is applied to the memory cells MC1 and MC3. Therefore, data is not written to the memory cells MC1 and MC3, or data is not read from the memory cells MC1 and MC3.

In a case of selecting the memory cell MC3, the word line driver WDRV places the transistor Tr2_1 in an on state to apply the low voltage Vlow to the word line WL1. The word line driver WDRV places the transistor Tr1_2 in an on state to apply the high voltage Vhigh to the word line WL2. In addition, the bit line driver BDRV places the transistor Tr3 in an on state to apply the high voltage Vhigh to the bit lines BL1 to BL3. Accordingly, a forward bias is applied to the memory cell MC3, so that a current flows from the bit line BL3 to the word line WL1. As a result, it is possible to write data to the memory cell MC3 or read data from the memory cell MC3.

Since a reverse bias is applied to the memory cell MC1 at this time, almost no current flows through the memory cell MC1. In addition, the word line WL2 and the bit lines BL2 and BL3 have the high voltage Vhigh and thus almost no voltage is applied to the memory cells MC2 and MC4. Therefore, data is not written to the memory cells MC2 and MC4, or data is not read from the memory cells MC2 and MC4.

In a case of selecting the memory cell MC4, the word line driver WDRV places the transistor Tr1_2 in an on state to apply the high voltage Vhigh to the word line WL2. The word line driver WDRV places the transistor Tr2_1 in an on state to apply the low voltage Vlow to the word line WL1. In addition, the bit line driver BDRV places the transistor Tr4 in an on state to apply the low voltage Vlow to the bit lines BL1 to BL3. Accordingly, a forward bias is applied to the memory cell MC4, so that a current flows from the word line WL2 to the bit line BL3. As a result, it is possible to write data to the memory cell MC4 or read data from the memory cell MC4.

Since a reverse bias is applied to the memory cell MC2 at this time, almost no current flows through the memory cell MC2. In addition, the word line WL1 and the bit lines BL1 and BL3 have the low voltage Vlow and thus almost no voltage is applied to the memory cells MC1 and MC3. Therefore, data is not written to the memory cells MC1 and MC3, or data is not read from the memory cells MC1 and MC3.

As described in the third embodiment, a pair of the transistors Tr1 and Tr2 may be connected to each of the word lines WL1 and WL2, and the transistors Tr3 and Tr4 may be connected to the bit lines BL1 to BL3 in common. Also in this case, it is possible to select any of the memory cells MC1 to MC4 and make a current flow through the selected memory cell.

Further, according to the third embodiment, the transistors Tr3 and Tr4 can be shared by a set of the bit lines BL1 to BL3. Accordingly, the third embodiment can reduce the circuit scale of a CMOS circuit and obtain effects identical to those of the second embodiment.

Fourth Embodiment

Figure 7:
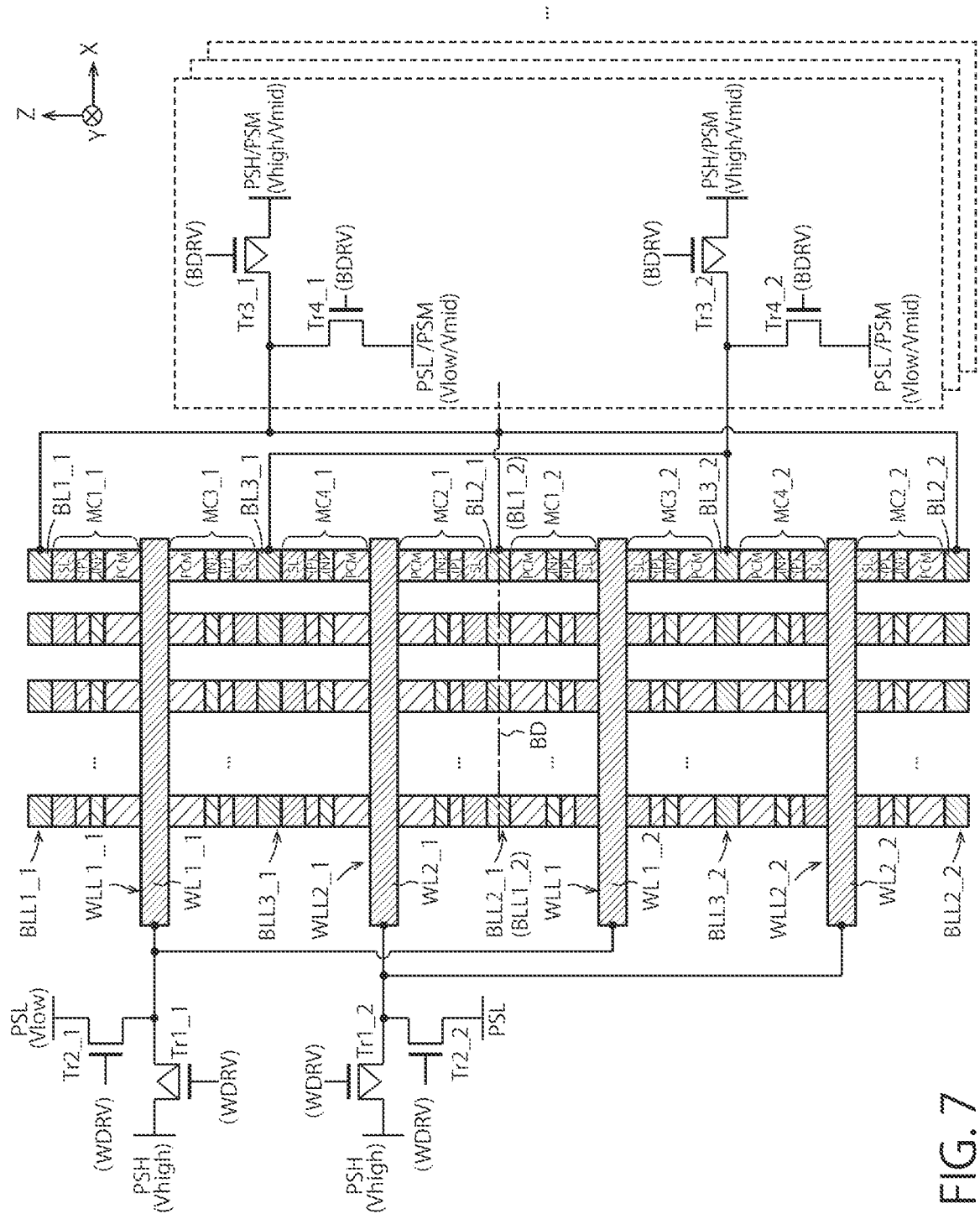
FIG. 7 is a schematic diagram illustrating an example of a storage device according to a fourth embodiment.

FIG. 7 is a schematic diagram illustrating an example of the storage device 100 according to a fourth embodiment. According to the fourth embodiment, the memory cell array MCA includes memory cells MC1_1 to MC4_1 and MC1_2 to MC4_2 in eight layers stacked in the Z direction.

In the memory cell array MCA, bit lines BL1_1 to BL3_1, word lines WL1_1 and WL2_1, and the memory cells MC1_1 to MC4_1 form one array set on one side of a boundary BD, and bit lines BL1_2 to BL3_2, word lines WL1_2 and WL2_2, and the memory cells MC1_2 to MC4_2 form another array set on the other side of the boundary BD. The two array sets are stacked in the Z direction to constitute the memory cell array MCA. The bit line BL2_1 and the bit line BL1_2 are formed by the same wire. The boundary BD is located at the middle position between the stack of the bit lines BL1_1 to BL3_1 and the word lines WL1_1 and WL2_1 and the stack of the bit lines BL1_2 to BL3_2 and the word lines WL1_2 and WL2_2.

Each array set may have a configuration identical to that of the memory cell array MCA in FIG. 5 or 6, but the orientations of the memory cells MC are different. For example, in the second embodiment, components (a PCM element, the diode DI, and the selector SL) of the respective memory cells MC1 to MC4 are arranged in the same manner in the Z direction. Meanwhile, in the fourth embodiment, components (a PCM element, the diode DI, and the selector SL) of the memory cells MC1_1 to MC4_1 or MC1_2 to MC4_2 in each array set are arranged in such a manner that the order of arrangement of the PCM element, the diode DI, and the selector SL is reversed in every other memory cell in the Z direction. That is, between the wiring layers WLL1_1 to WLL2_2 and the wiring layers BLL1_1 to BLL3_2 that are stacked, the memory cells MC1_1 to MC4_1 in which the arrangements are reverse to each other are alternately provided, and the memory cells MC1_2 to MC4_2 in which the arrangement orders are reverse to each other are alternately provided.

For example, the configuration of the memory cell MC1_1 and the configuration of the memory cell MC3_1 are symmetric with respect to the word line WL1_1. The configuration of the memory cell MC3_1 and the configuration of the memory cell MC4_1 are symmetric with respect to the bit line BL3_1. The configuration of the memory cell MC4_1 and the configuration of the memory cell MC2_1 are symmetric with respect to the word line WL2_1. The configuration of the memory cell MC1_2 and the configuration of the memory cell MC3_2 are symmetric with respect to the word line WL1_2. The configuration of the memory cell MC3_2 and the configuration of the memory cell MC4_2 are symmetric with respect to the bit line BL3_2. The configuration of the memory cell MC4_2 and the configuration of the memory cell MC2_2 are symmetric with respect to the word line WL2_2. In this manner, the configurations of the memory cells MC1_1 to MC4_1 and MC1_2 to MC4_2 may be arranged to be symmetric with respect to the bit lines BL and the word lines WL in each array set.

The transistors Tr1_1 and Tr2_1 are connected to the word lines WL1_1 and WL1_2 in common. The transistors Tr1_2 and Tr2_2 are connected to the word lines WL2_1 and WL2_2 in common. That is, a pair of the transistors Tr1_1 and Tr2_1 and a pair of the transistors Tr1_2 and Tr2_2 are alternately connected to the word lines WL1_1, WL2_1, WL1_2, and WL2_2.

The transistors Tr3_1 and Tr4_1 are connected to the bit lines BL1_1, BL2_1 (BL1_2), and BL2_2 in common. The transistors Tr3_2 and Tr4_2 are connected to the bit lines BL3_1 and BL3_2 in common. That is, a pair of the transistors Tr3_1 and Tr4_1 and a pair of the transistors Tr3_2 and Tr4_2 are alternately connected to the bit lines BL1_1, BL3_1, BL2_1 (BL1_2), BL3_2, and BL2_2.

The storage device 100 according to the fourth embodiment performs a read operation or a write operation in the following manner.

In a case of selecting the memory cell MC1_1, the word line driver WDRV places the transistor Tr2_1 in an on state to apply the low voltage Vlow to the word lines WL1_1 and WL1_2. The word line driver WDRV places the transistor Tr1_2 in an on state to apply the high voltage Vhigh to the word lines WL2_1 and WL2_2. In addition, the bit line driver BDRV places the transistor Tr3_1 in an on state to apply the high voltage Vhigh to the bit lines BL1_1, BL2_1 (BL1_2), and BL2_2. The bit line driver BDRV places either the transistor Tr3_2 or Tr4_2 in an on state to apply the middle voltage Vmid to the bit lines BL3_1 and BL3_2. Accordingly, a forward bias is applied to the memory cell MC1_1, so that a current flows from the bit line BL1_1 to the word line WL1_1. As a result, data can be written to the memory cell MC1_1, or data can be read from the memory cell MC1_1.

Since a reverse bias is applied to the memory cell MC1_2 at this time, almost no current flows through the memory cell MC1_2. Since the high voltage Vhigh is applied across both ends of each of the memory cells MC2_1 and MC2_2, a sufficient potential difference is not applied to the memory cells MC2_1 and MC2_2. Therefore, data is not written to the memory cells MC2_1 and MC2_2, or data is not read from the memory cells MC2_1 and MC2_2. In addition, the bit lines BL3_1 and BL3_2 have the middle voltage Vmid and thus a sufficient voltage is not applied to the memory cells MC3_1, MC4_1, MC3_2, and MC4_2. Therefore, data is not written to the memory cells MC3_1, MC4_1, MC3_2, and MC4_2, or data is not read from the memory cells MC3_1, MC4_1, MC3_2, and MC4_2.

In a case of selecting the memory cell MC3_1, while the low voltage Vlow is applied to the word lines WL1_1 and WL1_2 and the high voltage Vhigh is applied to the word lines WL2_1 and WL2_2, the bit line driver BDRV places the transistor Tr3_2 in an on state to apply the high voltage Vhigh to the bit lines BL3_1 and BL3_2. In addition, the bit line driver BDRV places either the transistor Tr3_1 or Tr4_1 in an on state to apply the middle voltage Vmid to the bit lines BL1_1, BL2_1 (BL1_2), and BL2_2. Accordingly, a forward bias is applied to the memory cell MC3_1, so that a current flows from the bit line BL3_1 to the word line WL1_1. As a result, it is possible to write data to the memory cell MC3_1 or read data from the memory cell MC3_1.

Since a reverse bias is applied to the memory cell MC3_2 at this time, almost no current flows through the memory cell MC3_2. Since the high voltage Vhigh is applied across both ends of each of the memory cells MC4_1 and MC4_2, a sufficient potential difference is not applied to the memory cells MC4_1 and MC4_2. Therefore, data is not written to the memory cells MC4_1 and MC4_2, or data is not read from them. In addition, the bit lines BL1_1, BL2_1 (BL1_2), and BL2_2 have the middle voltage Vmid and thus a sufficient voltage is not applied to the memory cells MC1_1, MC2_1, MC1_2, and MC2_2. Therefore, data is not written to the memory cells MC1_1, MC2_1, MC1_2, and MC2_2, or data is not read from them.

In a case of selecting the memory cell MC4_1, the low voltage Vlow is applied to the word lines WL2_1 and WL2_2 and the high voltage Vhigh is applied to the word lines WL1_1 and WL1_2. In addition, the high voltage Vhigh is applied to the bit lines BL3_1 and BL3_2 and the middle voltage Vmid is applied to the bit lines BL2_1 (BL1_2), and BL2_2. Accordingly, a forward bias is applied to the memory cell MC4_1, so that a current flows from the bit line BL3_1 to the word line WL2_1. As a result, it is possible to write data to the memory cell MC4_1 or read data from the memory cell MC4_1.

At this time, since a reverse bias is applied to the memory cell MC4_2, almost no current flows through the memory cell MC4_2. Since the high voltage Vhigh is applied across both ends of each of the memory cells MC3_1 and MC3_2, a sufficient potential difference is not applied to the memory cells MC3_1 and MC3_2. Therefore, data is not written to the memory cells MC3_1 and MC3_2, or data is not read from them. In addition, the bit lines BL1_1, BL2_1 (BL1_2), and BL2_2 have the middle voltage Vmid and thus a sufficient voltage is not applied to the memory cells MC1_1, MC2_1, MC1_2, and MC2_2. Therefore, data is not written to the memory cells MC1_1, MC2_1, MC1_2, and MC2_2, or data is not read from them.

In a case of selecting the memory cell MC2_1, the low voltage Vlow is applied to the word lines WL2_1 and WL2_2 and the high voltage Vhigh is applied to the word lines WL1_1 and WL1_2. In addition, the high voltage Vhigh is applied to the bit lines BL1_1, BL2_1 (BL1_2), and BL2_2 and the middle voltage Vmid is applied to the bit lines BL3_1 and BL3_2. Accordingly, a forward bias is applied to the memory cell MC2_1, so that a current flows from the bit line BL2_1 to the word line WL2_1. As a result, it is possible to write data to the memory cell MC2_1 or read data from the memory cell MC2_1.

At this time, since a reverse bias is applied to the memory cell MC2_2, almost no current flows through the memory cell MC2_2. Since the high voltage Vhigh is applied across both ends of each of the memory cells MC1_1 and MC1_2, a sufficient potential difference is not applied to the memory cells MC1_1 and MC1_2. Therefore, data is not written to the memory cells MC1_1 and MC1_2, or data is not read from them. In addition, the bit lines BL3_1 and BL3_2 have the middle voltage Vmid and thus a sufficient voltage is not applied to the memory cells MC3_1, MC4_1, MC3_2, and MC4_2. Therefore, data is not written to the memory cells MC3_1, MC4_1, MC3_2, and MC4_2, or data is not read from them.

An operation of selecting each of the memory cells MC1_2, MC3_2, MC4_2, and MC2_2 can be performed in an identical manner. For example, in a case of selecting the memory cell MC1_2, the low voltage Vlow is applied to the word lines WL2_1 and WL2_2 and the high voltage Vhigh is applied to the word lines WL1_1 and WL1_2. In addition, it suffices that the low voltage Vlow is applied to the bit lines BL1_1, BL2_1 (BL1_2), and BL2_2 and the middle voltage Vmid is applied to the bit lines BL3_1 and BL3_2.

Similarly, in a case of selecting the memory cell MC3_2, the low voltage Vlow is applied to the word lines WL2_1 and WL2_2 and the high voltage Vhigh is applied to the word lines WL1_1 and WL1_2. In addition, it suffices that the low voltage Vlow is applied to the bit lines BL3_1 and BL3_2 and the middle voltage Vmid is applied to the bit lines BL1_1, BL2_1 (BL1_2), and BL2_2.

In a case of selecting the memory cell MC4_2, the low voltage Vlow is applied to the word lines WL1_1 and WL1_2 and the high voltage Vhigh is applied to the word lines WL2_1 and WL2_2. In addition, it suffices that the low voltage Vlow is applied to the bit lines BL3_1 and BL3_2 and the middle voltage Vmid is applied to the bit lines BL1_1, BL2_1 (BL1_2), and BL2_2.

In a case of selecting the memory cell MC2_2, the low voltage Vlow is applied to the word lines WL1_1 and WL1_2 and the high voltage Vhigh is applied to the word lines WL2_1 and WL2_2. In addition, it suffices that the low voltage Vlow is applied to the bit lines BL1_1, BL2_1 (BL1_2), and BL2_2 and the middle voltage Vmid is applied to the bit lines BL3_1 and BL3_2.

As described above, according to the fourth embodiment, the word lines WL1_1 to WL2_2 and the bit lines BL1_1 to BL3_2 are alternately stacked, and the memory cells MC1_1 to MC4_2 in eight layers are each provided between any of the bit lines BL1_1 to BL3_2 and any of the word lines WL1_1 to WL2_2. A pair of the transistors Tr1_1 and Tr2_1 is connected to the word lines WL1_1 and WL1_2 in common, and a pair of the transistors Tr1_2 and Tr2_2 is connected to the word lines WL2_1 and WL2_2 in common. The transistors Tr3_1 and Tr4_1 are connected to the bit lines BL1_1, BL2_1 (BL1_2), and BL2_2 in common. The transistors Tr3_2 and Tr4_2 are connected to the bit lines BL3_1 and BL3_2 in common. However, since the memory cells MC1_1 to MC4_2 in eight layers each include the diode DI and have polarity dependence, it is possible to select any of the memory cells MC1_1 to MC4_2 by driving the transistors Tr1_1 to Tr2_2 and Tr3_1 to Tr4_2, thereby making a current flow through the selected memory cell.

According to the fourth embodiment, the transistors Tr1_1 to Tr2_2 and Tr3_1 to Tr4_2 can be shared by a plurality of word lines or a plurality of bit lines. Accordingly, it is possible to reduce the circuit scale of a CMOS circuit.

When the above description is generalized, word lines WLk_1 and WLk_2 are connected to a pair of transistors Tr1_k and Tr2_k in common, where k is an integer of 1 or more. In other words, the two word lines WLk_1 and WLk_2 arranged in every other layer (intermittently) are connected to the pair of transistors Tr1_k and Tr2_k in common.

Further, bit lines BLk_1 and BLk_2 (odd-numbered bit lines from the top in the Z direction) are connected to the transistors Tr3_1 and Tr4_1 in common. Bit lines BL3_k (even-numbered bit lines from the top in the Z direction) are connected to the transistors Tr3_2 and Tr4_2 in common. Accordingly, the present embodiment can be applied also to the memory cell array MCA having more than eight layers.

Fifth Embodiment

Figure 8:
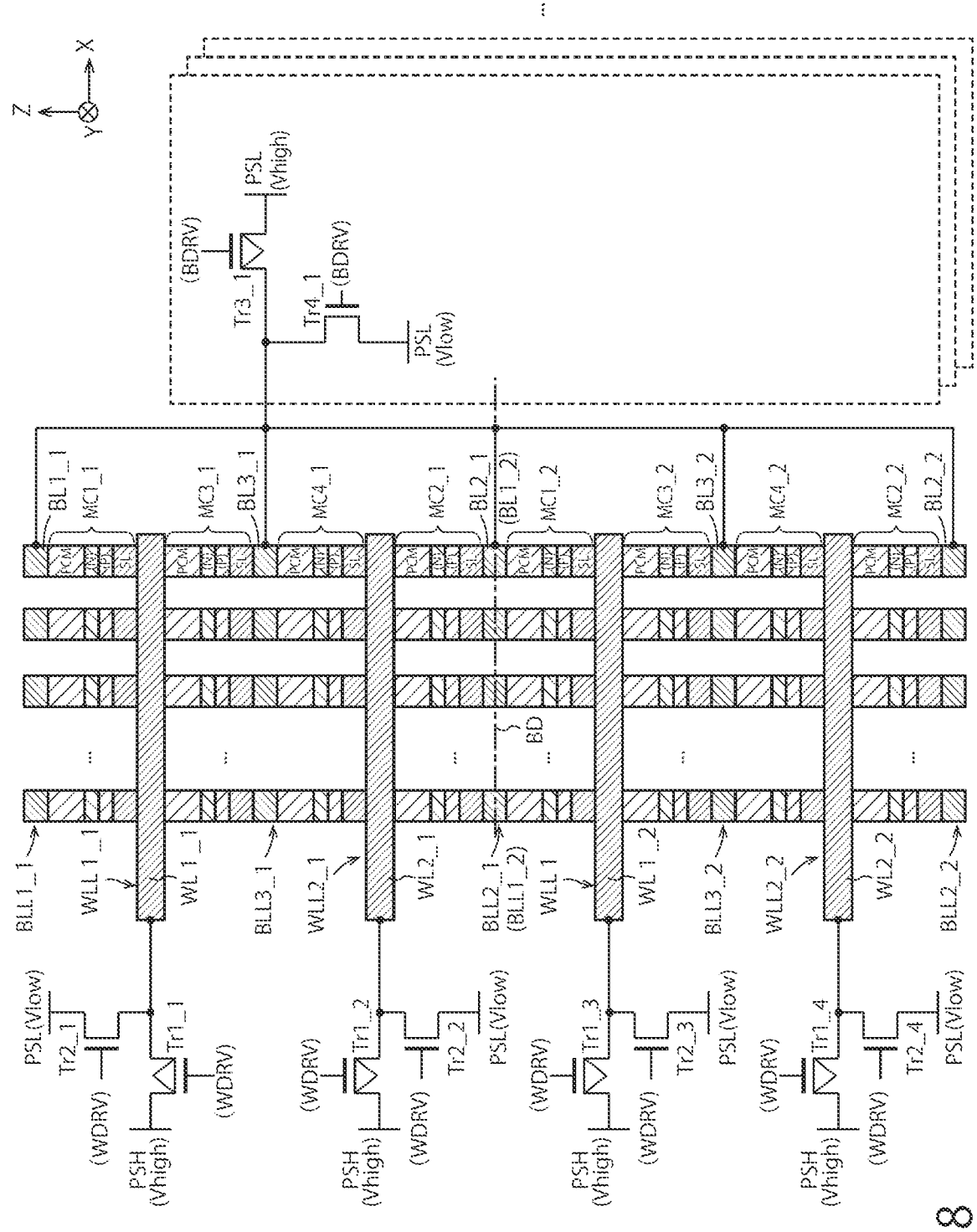
FIG. 8 is a schematic diagram illustrating an example of a storage device according to a fifth embodiment.

FIG. 8 is a schematic diagram illustrating an example of the storage device 100 according to a fifth embodiment. According to the fifth embodiment, the memory cell array MCA includes the memory cells MC1_1 to MC4_1 and MC1_2 to MC4_2 in eight layers stacked in the Z direction. The configuration of the memory cell array MCA may be identical to that of the memory cell array MCA according to the third embodiment.

The word lines WL1_1 to WL2_2 are respectively connected to different pairs of transistors Tr1_m and Tr2_m (m=1 to 4) separately. The bit lines BL1_1 to BL3_2 are connected to a pair of the transistors Tr3_1 and Tr4_1 in common. The fifth embodiment is obtained by expanding the third embodiment to the memory cell array MCA including eight layers.

The storage device 100 according to the fifth embodiment performs a read operation or a write operation in the following manner.

In a case of selecting the memory cell MC1_1, the word line driver WDRV places the transistor Tr1_1 in an on state to apply the high voltage Vhigh to the word line WL1_1. The word line driver WDRV places the transistors Tr2_2, Tr2_3, and Tr2_4 in an on state to apply the low voltage Vlow to the word lines WL2_1, WL1_2, and WL2_2. In addition, the bit line driver BDRV places the transistor Tr4_1 in an on state to apply the low voltage Vlow to the bit lines BL1_1 to BL3_2. Accordingly, a forward bias is applied to the memory cell MC1_1, so that a current flows from the word line WL1_1 to the bit line BL1_1. As a result, it is possible to write data to the memory cell MC1_1 or read data from the memory cell MC1_1.

At this time, since a reverse bias is applied to the memory cell MC3_1, almost no current flows through the memory cell MC3_1. Since the low voltage Vlow is applied across both ends of each of the other memory cells MC4_1, MC2_1, MC1_2, MC3_2, MC4_2, and MC2_2, a sufficient potential difference is not applied to the memory cells MC4_1, MC2_1, MC1_2, MC3_2, MC4_2, and MC2_2. Therefore, data is not written to the memory cells MC4_1, MC2_1, MC1_2, MC3_2, MC4_2, and MC2_2, or data is not read from the memory cells MC4_1, MC2_1, MC1_2, MC3_2, MC4_2, and MC2_2.

In a case of selecting the memory cell MC3_1, the word line driver WDRV places the transistor Tr2_i in an on state to apply the low voltage Vlow to the word line WL1_1. The word line driver WDRV places the transistors Tr1_2, Tr1_3, and Tr1_4 in an on state to apply the high voltage Vhigh to the word lines WL2_1, WL1_2, and WL2_2. In addition, the bit line driver BDRV places the transistor Tr3_1 in an on state to apply the high voltage Vhigh to the bit lines BL1_1 to BL3_2. Accordingly, a forward bias is applied to the memory cell MC3_1, so that a current flows from the bit line BL3_1 to the word line WL1_1. As a result, it is possible to write data to the memory cell MC3_1 or read data from the memory cell MC3_1.

At this time, since a reverse bias is applied to the memory cell MC1_1, almost no current flows through the memory cell MC1_1. Since the high voltage Vhigh is applied across both ends of each of the other memory cells MC4_1, MC2_1, MC1_2, MC3_2, MC4_2, and MC2_2, a sufficient potential difference is not applied to the memory cells MC4_1, MC2_1, MC1_2, MC3_2, MC4_2, and MC2_2. Therefore, data is not written to the memory cells MC4_1, MC2_1, MC1_2, MC3_2, MC4_2, and MC2_2, or data is not read from the memory cells MC4_1, MC2_1, MC1_2, MC3_2, MC4_2, and MC2_2.

Similarly, in a case of selecting the memory cell MC4_1, the high voltage Vhigh is applied to the word line WL2_1 and the low voltage Vlow is applied to the other word lines WL1_1, WL1_2, and WL2_2. In addition, the low voltage Vlow is applied to the bit lines BL1_1 to BL3_2. Accordingly, a forward bias is applied to the memory cell MC4_1, so that a current flows from the word line WL2_1 to the bit line BL3_1. As a result, it is possible to write data to the memory cell MC4_1 or read data from the memory cell MC4_1.

In a case of selecting the memory cell MC2_1, the low voltage Vlow is applied to the word line WL2_1 and the high voltage Vhigh is applied to the other word lines WL1_1, WL1_2, and WL2_2. In addition, the high voltage Vhigh is applied to the bit lines BL1_1 to BL3_2. Accordingly, a forward bias is applied to the memory cell MC2_1, so that a current flows from the bit line BL2_1 (BL1_2) to the word line WL2_1. As a result, it is possible to write data to the memory cell MC2_1 or read data from the memory cell MC2_1.

In a case of selecting the memory cell MC1_2, the high voltage Vhigh is applied to the word line WL1_2 and the low voltage Vlow is applied to the other word lines WL1_1, WL2_1, and WL2_2. In addition, the low voltage Vlow is applied to the bit lines BL1_1 to BL3_2. Accordingly, a forward bias is applied to the memory cell MC1_2, so that a current flows from the word line WL1_2 to the bit line BL2_1 (BL1_2). As a result, it is possible to write data to the memory cell MC1_2 or read data from the memory cell MC1_2.

In a case of selecting the memory cell MC3_2, the low voltage Vlow is applied to the word line WL1_2 and the high voltage Vhigh is applied to the other word lines WL1_1, WL2_1, and WL2_2. In addition, the high voltage Vhigh is applied to the bit lines BL1_1 to BL3_2. Accordingly, a forward bias is applied to the memory cell MC3_2, so that a current flows from the bit line BL3_2 to the word line WL1_2. As a result, it is possible to write data to the memory cell MC3_2 or read data from the memory cell MC3_2.

In a case of selecting the memory cell MC4_2, the high voltage Vhigh is applied to the word line WL2_2 and the low voltage Vlow is applied to the other word lines WL1_1, WL2_1, and WL1_2. In addition, the low voltage Vlow is applied to the bit lines BL1_1 to BL3_2. Accordingly, a forward bias is applied to the memory cell MC4_2, so that a current flows from the word line WL2_2 to the bit line BL3_2. As a result, it is possible to write data to the memory cell MC4_2 or read data from the memory cell MC4_2.

In a case of selecting the memory cell MC2_2, the low voltage Vlow is applied to the word line WL2_2 and the high voltage Vhigh is applied to the other word lines WL1_1, WL2_1, and WL1_2. In addition, the high voltage Vhigh is applied to the bit lines BL1_1 to BL3_2. Accordingly, a forward bias is applied to the memory cell MC2_2, so that a current flows from the bit line BL2_2 to the word line WL2_2. As a result, it is possible to write data to the memory cell MC2_2 or read data from the memory cell MC2_2.

As described above, by connecting different pairs of the transistors Tr1_m and Tr2_m (m=1 to 4) to the word lines WL1_1 to WL2_2 in one-to-one correspondence, a pair of the transistors Tr3_1 and Tr4_1 can be shared by all the bit lines BL1_1 to BL3_2.

The fifth embodiment can be applied to the memory cell array MCA having more than eight memory layers.

(Number of Transistors)

According to the first embodiment, the number of wiring layers of bit lines and word lines is three, whereas the number of pairs of transistors, that is, a pair of the transistors Tr1 and Tr2 and a pair of the transistors Tr3 and Tr4 is two.

According to the second embodiment, the number of wiring layers of bit lines and word lines is five, whereas the number of pairs of transistors, that is, a pair of the transistors Tr1 and Tr2, a pair of the transistors Tr3 and Tr4, and a pair of the transistors Tr5 and Tr6 is three.

Also in the third embodiment, the number of wiring layers of bit lines and word lines is five, whereas the number of pairs of transistors, that is, a pair of the transistors Tr1_1 and Tr2_1, a pair of the transistors Tr1_2 and Tr2_2, and a pair of the transistors Tr3 and Tr4 is three.

According to the fourth embodiment, the number of wiring layers of bit lines and word lines is nine, whereas the number of pairs of transistors, that is, a pair of the transistors Tr1_1 and Tr2_1, a pair of the transistors Tr1_2 and Tr2_2, a pair of the transistors Tr3_1 and Tr4_1, and a pair of the transistors Tr3_2 and Tr4_2 is four.

According to the fifth embodiment, the number of wiring layers of bit lines and word lines is nine, whereas the number of pairs of transistors, that is, a pair of the transistors Tr1_1 and Tr2_1, a pair of the transistors Tr1_2 and Tr2_2, a pair of the transistors Tr1_3 and Tr2_3, a pair of the transistors Tr1_4 and Tr2_4, and a pair of the transistors Tr3_1 and Tr4_1 is five.

According to the first to third and fifth embodiments, when the number of wiring layers of bit lines and word lines is n, the number of pairs of transistors such as the transistors Tr1 and Tr2 is $(n+1)/2$. In this manner, about half of the number of wiring layers of bit lines and word lines is enough for the number of pairs of transistors in the storage device 100 according to the firth to third and fifth embodiments. According to the fourth embodiment, when the number of wiring layers of bit lines and word lines is n, the number of pairs of transistors such as the transistors Tr1 and Tr2 is $(n-1)/2$. In this manner, according to the fourth embodiment, the number of pairs of transistors can be less than half of the number of wiring layers of bit lines and word lines.

Further, from a viewpoint of the number of layers of the memory cells MC, when the number of memory layers is m, the number of pairs of transistors such as the transistors Tr1 and Tr2 is $(m/2)+1$ according to the first to third and fifth embodiments. In this manner, the number of pairs of transistors in the storage device 100 according to the first to third and fifth embodiments is about half of the number of memory layers. Further, according to the fourth embodiment, when the number of memory layers is m, the number of pairs of transistors such as the transistors Tr1 and Tr2 is $m/2$. In this manner, according to the fourth embodiment, the number of pairs of transistors can be half of the number of memory layers. As a result, it is possible to reduce the circuit scale of a CMOS circuit as a memory controller.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of first wires;
a plurality of second wires;
first and second transistors connected to one or ones of the first wires and configured to respectively transfer a first voltage and a second voltage lower than the first voltage to the connected first wire or wires;
third and fourth transistors connected to the second wires and configured to respectively transfer the first and second voltages to the second wires;
a first memory cell including a first diode and a first memory element connected in series, the first memory cell being connected between a first signal line of the second wires and one of the first wires in such a manner that a forward bias direction of the first diode is from the one first wire to the first signal line; and
a second memory cell including a second diode and a second memory element connected in series, the second memory cell being connected between a second signal line of the second wires and the one of the first wires in such a manner that a forward bias direction of the second diode is from the second signal line to the one first wire.

2. The device of claim 1, wherein
a wiring layer of a plurality of the first signal lines and a wiring layer of a plurality of the second signal lines are provided to correspond to a wiring layer of the first wires,
a plurality of pairs of the third and fourth transistors are provided to correspond to respective pairs of the first and second signal lines,
a plurality of the first memory cells are provided between the first wires and the first signal lines, respectively, and
a plurality of the second memory cells are provided between the first wires and the second signal lines, respectively.

3. The device of claim 1, wherein
the first and third transistors are p-FETs, and
the second and fourth transistors are n-FETs.

4. The device of claim 1, wherein the first and second memory elements are memory elements each allowing a first logic and a second logic different from the first logic to be written thereto by voltage application from one direction.

5. The device of claim 4, wherein the first and second memory elements are PCMs (Phase Change Memories).

6. The device of claim 1, wherein
the first memory cell includes the first diode, the first memory element, and a first selector connected in series, and
the second memory cell includes the second diode, the second memory element, and a second selector connected in series.

7. The device of claim 1, wherein
a forward bias is applied to the first memory cell by placing the first and fourth transistors in a conducting state, and
a forward bias is applied to the second memory cell by placing the second and third transistors in a conducting state.

8. The device of claim 1, wherein
the first and second transistors are connected to the first wires,
the second wires include a third signal line provided between two of the first wires, and
the device further comprises:
fifth and sixth transistors connected to the third signal line and configured to transfer the first voltage, the second voltage, or a middle voltage between the first voltage and the second voltage;
a third memory cell including a third diode and a third memory element connected in series, the third memory cell being connected between one of the two first wires and the third signal line in such a manner that a forward bias direction of the third diode is from the third signal line to the one first wire; and
a fourth memory cell including a fourth diode and a fourth memory element connected in series, the fourth memory cell being connected between the other one of the two first wires and the third signal lines in such a manner that a forward bias direction of the fourth diode is from the other first wire to the third signal line.

9. The device of claim 1, wherein
the second wires include a third signal line provided between two of the first wires,
the first and second transistors are connected to one of the two first wires, and
the device further comprises:
fifth and sixth transistors connected to the other one of the two first wires and configured to respectively transfer the first and second voltages to the other one of the two first wires;
a third memory cell including a third diode and a third memory element connected in series, the third memory cell being connected between the one of the two first wires and the third signal line in such a manner that a forward bias direction of the third diode is from the one first wire to the third signal line; and
a fourth memory cell including a fourth diode and a fourth memory element connected in series, the fourth memory cell being connected between the other one of the two first wires and the third signal lines in such a manner that a forward bias direction of the fourth diode is from the third signal line to the other first wire.

10. The device of claim 1, wherein
a first wiring layer including the first wires and a second wiring layer including the second wires are alternately stacked in a first direction,
the plurality of the first memory cells and the plurality of the second memory cells are provided between the first wiring layers and the second wiring layers to be alternately arranged in the first direction on each side of a middle position of a stack of the first and second wiring layers,
wherein the device further comprises:
fifth and sixth transistors connected to the first wires and configured to transfer the first and second voltages, respectively, to the first wires; and
seventh and eighth transistors connected to the second wires and configured to transfer the first and second voltages, respectively, to the second wires,
wherein an odd-numbered layer of the first wiring layers is connected to the first and second transistors in common,
an even-numbered layer of the first wiring layers is connected to the fifth and sixth transistors in common,
an odd-numbered layer of the second wiring layers is connected to the third and fourth transistors in common, and
an even-numbered layer of the second wiring layers is connected to the seventh and eighth transistors in common.

11. The device of claim 1, wherein
a first wiring layer including the first wires and a second wiring layer including the second wires are alternately stacked in a first direction,
the plurality of the first memory cells and the plurality of the second memory cells are provided between the first wiring layers and the second wiring layers to be alternately arranged in the first direction on each side of a middle position of a stack of the first and second wiring layers,
the first wiring layers are connected to different pairs of the first and second transistors, respectively, and
the second wiring layers are connected to the third and fourth transistors in common.

* * * * *